United States Patent [19]

Shikata

[11] Patent Number: 5,264,379
[45] Date of Patent: Nov. 23, 1993

[54] METHOD OF MAKING A HETERO-JUNCTION BIPOLAR TRANSISTOR

[75] Inventor: Shinichi Shikata, Yokohama, Japan

[73] Assignee: Sumitomo Electric Industries, Inc., Osaka, Japan

[21] Appl. No.: 20,461

[22] Filed: Feb. 22, 1993

Related U.S. Application Data

[63] Continuation of Ser. No. 697,986, May 10, 1991, abandoned.

[30] Foreign Application Priority Data

May 14, 1990 [JP] Japan .................. 2-123895
Aug. 1, 1990 [JP] Japan .................. 2-204530

[51] Int. Cl.⁵ .......................................... H01L 21/265
[52] U.S. Cl. ................................. 437/31; 437/184; 437/234; 148/DIG. 64; 148/DIG. 72; 148/DIG. 11
[58] Field of Search .................. 437/31, 126, 133, 32, 437/33; 148/DIG. 72, DIG. 10, DIG. 11, DIG. 160

[56] References Cited

U.S. PATENT DOCUMENTS

| | | | |
|---|---|---|---|
| 4,162,203 | 7/1979 | Eden et al. | 437/61 |
| 4,467,521 | 8/1984 | Spooner et al. | 437/176 |
| 4,499,656 | 2/1985 | Fabian et al. | 437/176 |
| 4,617,724 | 10/1986 | Yokoyama et al. | 437/200 |
| 4,751,201 | 6/1988 | Nottenburg et al. | 437/225 |
| 4,772,489 | 9/1988 | Shikata | 437/170 |
| 4,835,117 | 5/1989 | Ohba et al. | 148/DIG. 95 |
| 4,920,078 | 4/1990 | Bagley et al. | 437/225 |
| 4,962,065 | 10/1990 | Brown et al. | 148/DIG. 114 |
| 4,977,100 | 12/1990 | Shimura | 437/912 |

OTHER PUBLICATIONS

H. Oigawa et al., Studies on an (NH4) 2SX-Treated GAAS Surface Using Aes, Leels and Rheed, Japanese Journal of Applied Physics vol. 28, No. 3, Mar. 1989, Tokyo, Japan pp. L430-L342, XP205861.

*Primary Examiner*—Brian E. Hearn
*Assistant Examiner*—Michael Trinh
*Attorney, Agent, or Firm*—Cushman, Darby & Cushman

[57] ABSTRACT

A method of manufacturing a heterojunction bipolar transistor is disclosed. On a base layer of a first semiconductor which contains at least one of gallium and arsenic as a constituent element, an emitter layer of a second semiconductor is formed which contains as a constituent element at least one of gallium and arsenic and which has a band gap larger that of the first semiconductor. Predetermined regions of the emitter layer and an upper portion of the base layer are removed to form a mesa structure. Then, a surface of a junction region of the base layer and the emitter layer of the formed mesa structure is treated using a phosphate etchant and a sulfur or sulfide passivating agent. After the surface treatment, the surface of the junction is covered with an insulating film.

10 Claims, 4 Drawing Sheets

METHOD OF MAKING A HETERO-JUNCTION BIPOLAR TRANSISTOR

This is a continuation of application Ser. No. 07/697,986, filed on May 10, 1991, which was abandoned upon the filing hereof.

BACKGROUND OF THE INVENTION

1. Field of the Invention

The present invention relates to a method of manufacturing a heterojunction bipolar transistor and, more particularly, to a surface passivation technique for an outer periphery of an emitter-base junction or an outer periphery of a collector-base junction.

2. Related Background Art

A heterojunction bipolar transistor (HBT) has an ultra-high operation speed and a good current drive capacity compared to a field effect transistor, and thus attracts attention as a device of a new generation. An HBT directly uses an epitaxial crystal formed by MBE or MOCVD so that HBT characteristics are fully utilized. As a result, e.g., in an emitter-up HBT, etching is performed to form a base electrode, and accordingly the outer periphery of the emitter-base junction is exposed. Along with the micropatterning of an HBT, the emitter size of an emitter-up HBT or the collector size of a collector-up HBT is decreased. Then, surface recombination occurs in the exposed junction, posing a serious problem in decrease in gain. In other words, the higher the value (peripheral length)/(device area), the greater the influence from the surface.

As a method of solving this problem, it is conventionally proposed to form a base layer having an inclined structure. However, when the emitter or collector size becomes sufficiently small (e.g., 1 $\mu m^2$), this conventional method is not very effective. In addition, it is difficult to form a contact with the base having the inclined structure, resulting in numerous problems.

Moreover, in the above structure, dangling bonds still remain on the exposed surface of the HBT to disturb surface rearrangement. A surface level is then formed to serve as the carrier trapping center. In order to substantially solve this problem, it is important to perform passivation to decrease the dangling bonds.

SUMMARY OF THE INVENTION

It is an object of the present invention to provide a method of manufacturing a micropatterned HBT by substantially decreasing dangling bonds and thus decreasing recombination centers.

It is another object of the present invention to provide a method of manufacturing an HBT by forming on a base layer comprising a first semiconductor containing at least gallium or arsenic as a constituent element, and an emitter (or collector) layer comprising a second semiconductor containing at least gallium or arsenic as a constituent element and having a band gap larger than that of the first semiconductor, and removing predetermined upper regions of the emitter (or collector) layer and upper portion of the base layer, thus obtaining a mesa structure, characterized by applying a surface treatment using sulfur or sulfide to perform sulfur or sulfide passivation to an exposed portion of a junction of the emitter (or collector) layer and the base layer after the mesa structure is formed, and thereafter covering the structure with an insulating film.

It is still another object of the present invention to provide a method of manufacturing an HBT, wherein, prior to the surface treatment using sulfur or sulfide, surface treatment is performed using a phosphate-based etchant.

It is still another object of the present invention to provide a method of manufacturing an HBT, wherein an SiN film made by ECR-CVD is used as an insulating film, and the SiN film is annealed.

According to the methods of manufacturing HBTs, as described above, sulfur or sulfide passivation is performed to the exposed portion of the junction of the first and second semiconductors where dangling bonds are likely to be formed. Therefore, it is possible to decrease the dangling bonds. In addition, since the surface layer is removed using the phosphate-based etchant, the effect of decreasing the dangling bonds is further enhanced. Since formation of the insulating film by ECR-CVD and annealing of the formed insulating film are also combined, it is possible to prevent a decrease in effect of decreasing the dangling bonds by sulfur passivation. As a result, by sufficiently decreasing the dangling bonds and thus decreasing the recombination centers, a micropatterned HBT having a sufficiently high current gain can be manufactured in accordance with simple steps.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

DETAILED DESCRIPTION OF THE PREFERRED EMBODIMENTS

A manufacturing method according to the first embodiment of the present invention will be described with reference to FIG. 1.

Figure 1:
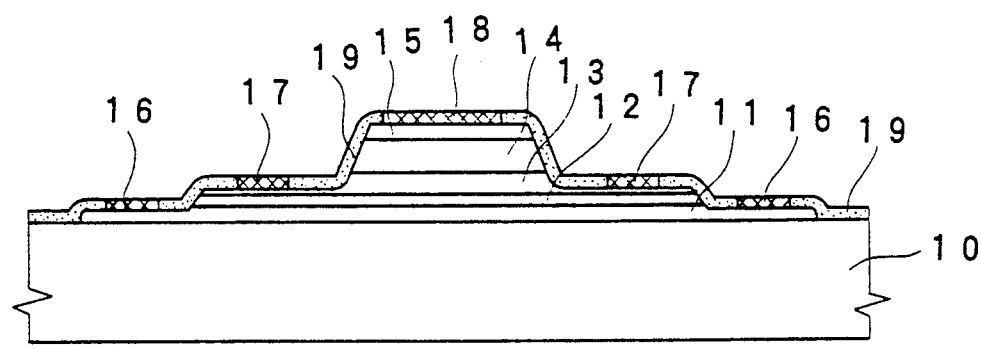
FIG. 1 is a sectional view of an emitter-up HBT to which the first embodiment of the present invention is applicable.

As shown in FIG. 1, a collector contact layer 11 consisting of $n^+$-type GaAs, a collector layer 12 consisting of n-type GaAs, a base layer 13 consisting of p-type GaAs (first semiconductor), an emitter layer 14 consisting of n-type $Al_{0.3}Ga_{0.7}As$ (second semiconductor), and an emitter contact layer 15 consisting of $n^+$-type GaAs are sequentially formed on a GaAs substrate 10. A upper portion of the base layer 13 and predetermined peripheral regions of the emitter layer 14 and the emitter contact layer 15 are removed by mesa etching to form an HBT mesa structure. Similarly, a upper portion of the collector contact layer 11 and a peripheral region of the collector layer 12 are removed by mesa etching. An AuGe/Ni collector electrode 16 is formed on the collector contact layer 11. An AuZn/Au base electrode 17 is formed on the base layer 13. An AuGe/Ni emitter electrode 18 is formed on the emitter contact layer 15. An insulating film 19 of $SiO_2$ or $SiN_x$ is deposited on the remaining surface of the HBT not covered by the electrodes.

In the process of manufacturing a heterojunction bipolar transistor as described above, as for-the present embodiment, an $(NH_4)_2S_x$ treatment is performed immediately after the HBT mesa structure is formed by etching so that S (sulfur) attaches the surface of the structure. The sulfur or sulfide passivation (S-passivation) mechanism is described in, e.g., a literature "Japanese Journal of Applied Physics", Vol. 28, No. 3, pp. L340 to L342, March 1989. S atoms are combined with Ga, Al, and As atoms constituting a semiconductor, thereby saturating the dangling bonds described above. As a result, carrier recombination in the base-emitter interface is suppressed, and the gain may not be decreased even when the element size is greatly reduced. After the S treatment, the insulating film 19 consisting of $SiO_2$, $SiN_x$, or the like is deposited, and electrodes are formed thereon.

In the manufacturing steps described above, S-passivation can be performed in accordance with any method as far as S is combined with Ga, Al, As, and the like. In this embodiment, it is preferable to use $(NH_4)_2S_x$ ($x>1$) as a similar compound to $(NH_4)_2S_x$. More specifically, when $(NH_4)_2S$ is used as a similar compound to $(NH_4)_2S_x$, the sulfur content is small and the dangling bonds are not sufficiently saturated. When $Na_2S.9H_2O$ or the like is used, the device surface might become unstable after the treatment.

When an HBT is formed in, e.g., a (100) plane, the direction from the emitter to the base of the HBT is preferably set to a $<011>$ direction. Then, the etching planes become a (111) plane and a ($\bar{1}\bar{1}1$) plane or a plane close to this. Since these planes are the planes of III-group Ga and Al, the passivation effect is enhanced by GaS and AlS that are bonded stronger than AsS. In the case of a self-alignment process, etching to connect a base electrode is performed by RIE or the like. In this case, wet etching is finally performed to moderate the surface damage. Then, the above-mentioned crystal planes appear in a microscopic manner.

Sulfur deposited on the surface of the device during S-passivation is amorphous. In vacuum, amorphous sulfur sublimes. However, if preheated, it does not sublime but remains. Therefore, it is preferable that formation of the insulating film 19 after sulfur passivation is performed in accordance with a low-temperature process such as sputtering or ECR-CVD. In particular, with ECR-CVD, no damage is caused by plasma and the loss of effect of the S treatment is small compared to the case of plasma process. As an insulating film, an organic polyimide film or an inorganic SOG film may be formed by wet process.

The present inventor conducted the following experiments to check effectiveness of this embodiment.

First, n+-type GaAs (collector contact layer 11), n-type GaAs (collector layer 12), p-type GaAs (base layer 13), n-type $Al_{0.3}Ga_{0.7}As$ (emitter layer 14), and n+-type GaAs (emitter contact layer 15) were formed on a GaAs substrate in the same manner as in FIG. 1. The n+-type GaAs emitter contact layer was patterned and etched down to the base layer using an $H_3PO_4$-based etchant. Subsequently, the base layer was patterned and etched down to the collector contact layer. Similarly, the collector contact layer was patterned and etched down to the substrate. Thereafter, the overall structure was slightly etched and treated with $(NH_4)_2S_x$ for 10 minutes. An SiN film was formed by ECR-CVD as an insulating film to a thickness of 2,000 Å, and emitter, collector, and base electrodes were formed by the spacer lift-off technique. As a comparative example, an HBT was formed following the same procedures as described above except that the treatment with $(NH_4)_2S_x$ is not performed. Current gains $\beta$ ($=\Delta I_C/\Delta I_B$) of HBTs of various sizes were measured. As a result, in the conventional HBT which had not been treated with $(NH_4)_2S_x$, when the value (peripheral length)/(device area) was increased from $1.5 \times 10^3$ cm$^{-1}$ to $40 \times 10^3$ cm$^{-1}$, the gain $\beta$ for $Jc = 1 \times 10^4$ cm$^{-2}$ was decreased from 100 to 10. In contrast to this, in the HBT which is treated with $(NH_4)_2S_x$ and which is of the $<011>$ direction, the gain $\beta$ will be decreased merely to half and will be exhibited good characteristics. In other HBTs of the directions other than $<011>$, the gain B will be decreased merely to half and will be exhibited good characteristics.

Figure 2:
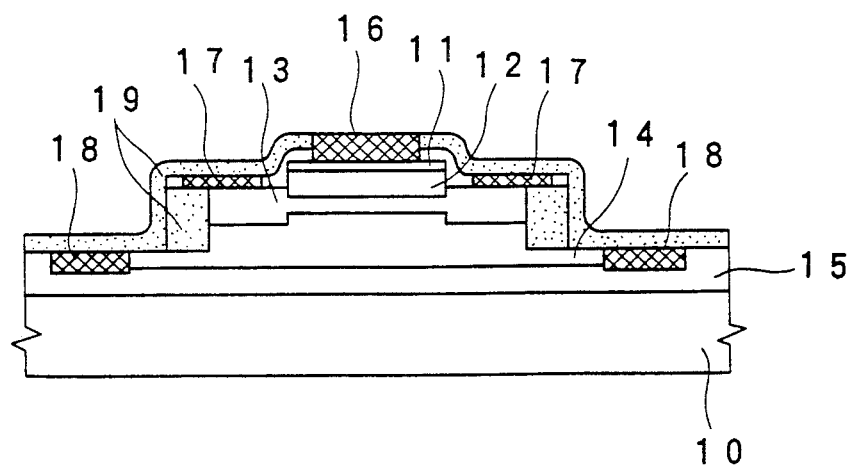
FIG. 2 is a sectional view of a collector-up HBT to which the second embodiment of the present invention is applicable.

The first embodiment relates to an emitter-up HBT. However, the present invention can similarly be applied to a collector-up HBT. In this case, the dangling bonds are combined with sulfur especially at the exposed portion of the collector-base junction. FIG. 2 shows the structure of a collector-up AlGaAs/GaAs HBT. Referring to FIG. 2, both collector electrode 16 and emitter electrode 18 comprise an AuGe/Ni/Ti/Pt/Au structure. A base electrode 17 comprises a Ti/Pt/Au structure. An insulating film 19 is made of SiN or $SiO_2$ in accordance with ECR-CVD.

When sulfur passivation is performed before forming the insulating film as the passivation film as described above, the characteristics of the HBT can be improved. The present inventor made extensive studies on the following respects in order to further increase this effect.

First, the effect obtained by slightly removing the surface layer by the phosphate-based etchant prior to S-passivation was studied. An $NH_4OH$-based etchant and an $H_2SO_4$-based etchant were used as non isotropical (or mesa) etchants with which the crystal plane after etching forms an inverted mesa structure and a normal mesa structure, respectively. The effect of pretreatment using these etchants and the effect of pretreatment using a phosphate-based etchant as an etchant with which the crystal plane forms a normal mesa structure in all directions were compared. Secondly, the effect obtained when ECR-CVD was employed as the method of forming an insulating film as the passivation film was studied. Passivation films were formed in accordance with various methods, e.g., plasma CVD, thermal CVD, and sputtering. The obtained films were compared with a passivation film formed in accordance with ECR-CVD. Thirdly, the effect obtained by performing annealing after formation of the passivation insulating film was studied. An SiN insulating film and an $SiO_2$ insulating film, both of which were formed in accordance with ECR-CVD, were compared to study their effect. These three points will be described.

The present inventor compared the effects of treatments, performed prior to S-passivation using various types of etchants, by way of a PL (photoluminescence) intensity.

Figure 3:
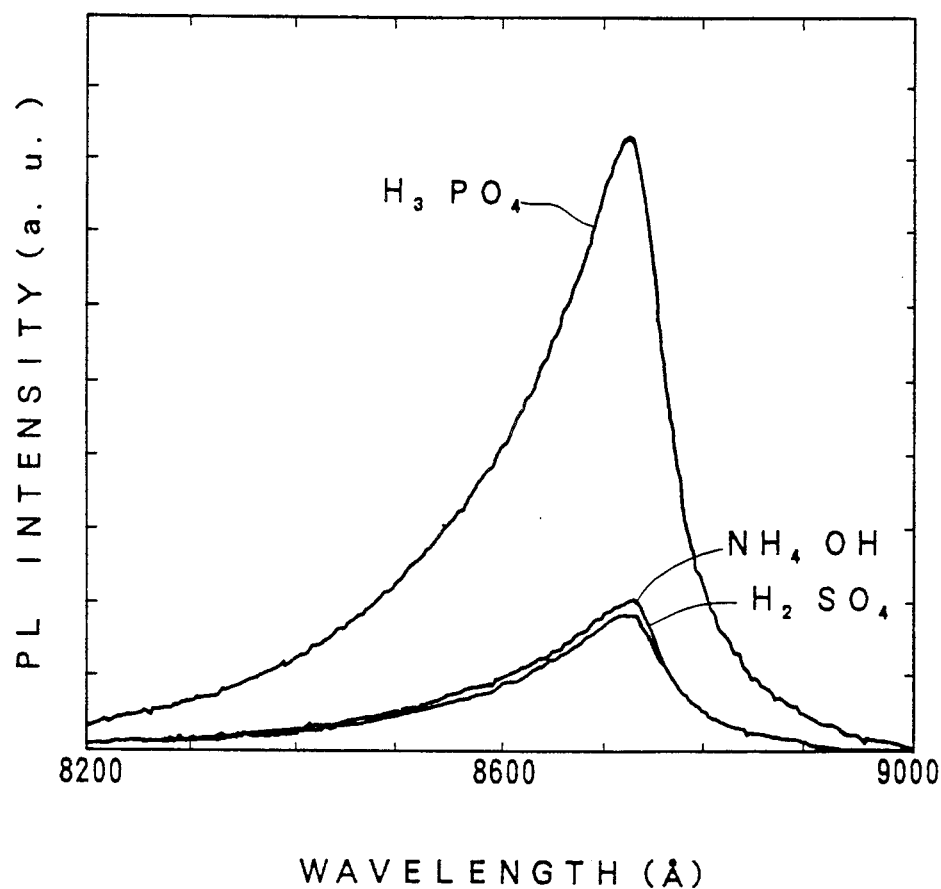
FIG. 3 is a graph showing an effect of a pre-treatment using a phosphate-based etchant.

FIG. 3 shows the obtained results. As shown in FIG. 3, when etching is performed using an etchant containing $H_3PO_4$, a high PL intensity is obtained at a wavelength corresponding to a band edge. In contrast to this, when etching is performed using a so-called non-isotropical etchant, e.g., an ammonium- or sulfuric acid-based etchant, no great improvement is obtained. In this case, an opposite mesa etchant refers to an etchant with which the etched surface exhibits an inverted or normal mesa structure. With a phosphate-based etchant, the etched surface exhibits a normal mesa structure in all directions. Therefore, the phosphate-based etchant will be referred to as a isotropic mesa etchant.

Then, the present inventor compared the PL intensities of respective film deposition methods.

Figure 4:
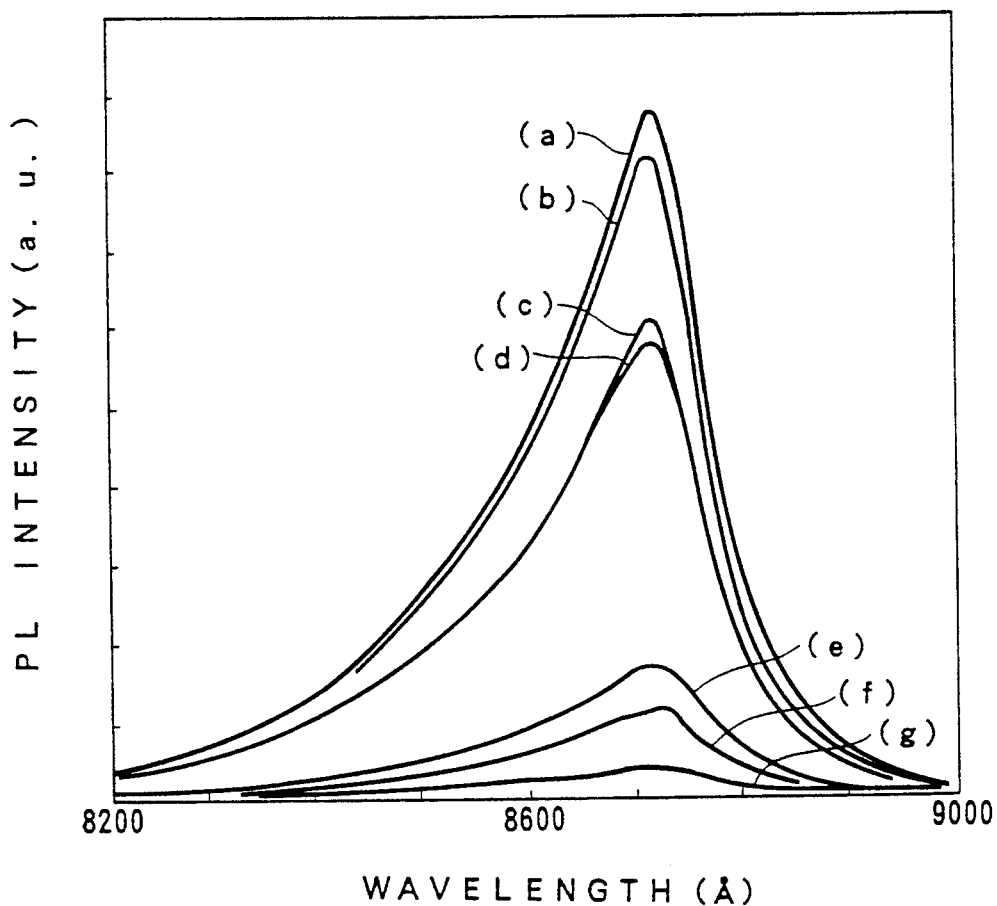
FIG. 4 is a graph showing an effect of various film formation method.

FIG. 4 shows obtained results. Referring to FIG. 4, a curve a represents a result when an insulating film was formed by ECR-CVD after S-passivation. A high PL intensity was obtained at a wavelength corresponding to a band edge. A curve b represents a result when S-passivation was performed but an insulating film was not formed. It is apparent from these results that when ECR-CVD is used, the effect of S-passivation is not degraded at all due to the following facts. Namely, in an ECR-CVD system, a plasma chamber and a film forming chamber are separately provided. Therefore, the plasma shower will not damage a GaAs semiconductor.

Curves c and d represent results when a film was formed by sputtering and thermal CVD, respectively. It is obvious that in these cases the effect of S-passivation was degraded compared to the case of ECR-CVD. A curve e represents a result when an insulating film was formed by plasma CVD at RF=13.56 MHz, and a curve g represents a result when an insulating film was formed by plasma CVD at RF=50 kHz. It is obvious that the effect of S-passivation was greatly degraded. A curve f represents a result when no treatment was performed.

Then the present inventor studied the effect of annealing after formation of the insulating film.

Figure 5:
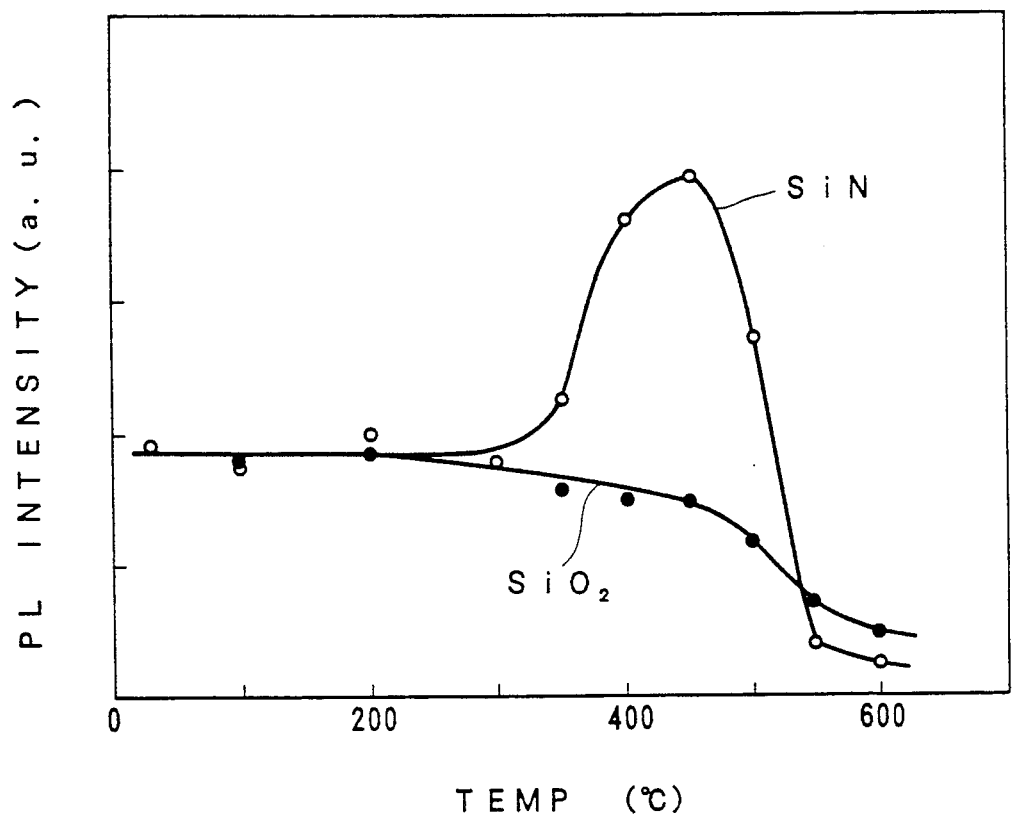
FIG. 5 is a graph showing an effect of annealing.

FIG. 5 shows obtained results. An SiN film formed in accordance with ECR-CVD exhibits a higher PL intensity when it is annealed at a temperature of 380° to 520° C., and especially 400° to 500° C. In contrast to this, an $SiO_2$ film is not improved by annealing even when it is formed in accordance with ECR-CVD. Annealing was performed in an nitrogen gas atmosphere for 30 minutes.

Finally, the present inventor fabricated an emitter-up HBT sample to study the effect of the present invention.

First, an HBT mesa structure as shown in FIG. 1 was formed and its surface was removed by etching by a depth of about 50 Å by using an etchant having a composition:

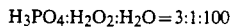

$H_3PO_4:H_2O_2:H_2O = 3:1:100$

Subsequently, the mesa structure was dipped in a solution of $(NH_4)_2S_x$ for 10 minutes, washed with water for about 20 seconds, and subjected to nitrogen blow to remove water. An SiN passivation film was formed on the mesa structure by ECR-CVD and the structure was annealed at 450° C. for 30 minutes in a nitrogen gas atmosphere. When the value of (peripheral lenght)/(device area) of this HBT was increased from $5 \times 10^3$ cm$^{-1}$ to $40 \times 10^3$ cm$^{-1}$, the gain $\beta$ for Jc$= 1 \times 10^4$ cm$^{-1}$ was merely decreased from 105 to 75. In contrast to this, when an $NH_4OH$-based etchant was used in place of the $H_3PO_4$-based etchant and a passivation film was formed by plasma CVD, the gain $\beta$ was decreased from 105 to 50. When S-passivation was not performed, the gain $\beta$ was decreased from 105 to 10.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

I claim:

1. A method of manufacturing a heterojunction bipolar transistor, including the steps of:

forming, on a base layer of a first semiconductor which contains at least one of gallium and arsenic as a constituent element, an emitter layer of a second semiconductor which has at least one of gallium and arsenic as a constituent element and which has a band gap larger than that of the first semiconductor;

removing predetermined regions of the emitter layer and an upper portion of the base layer to form a mesa structure;

slightly etching a surface of a junction region of the base layer and the emitter layer, which is exposed on an edge of the formed mesa structure, using a phosphate-based etchant;

treating said surface of said junction region of the base layer and the emitter layer using a sulfur or sulfide passivating agent; and covering the surface of the junction region with an insulating film.

2. A method according to claim 1, wherein the step of covering the surface includes the step of covering the surface of the junction region by an ECR-CVD method.

3. A method according to claim 1, wherein the step of covering the junction region includes the step of covering the surface of the junction region with an SiN film by the ECR-CVD method and thereafter performing annealing at 380° to 520° C.

4. A method according to claim 1, wherein the first and second semiconductors contain, as a constituent element, at least one element selected from the group consisting of aluminum, indium, phosphorus, and antimony.

5. A method of manufacturing a heterojunction bipolar transistor, including the steps of:

forming, on a base layer of a first semiconductor which contains at least one of gallium and arsenic as a constituent element, a collector layer of a second semiconductor which has at least one of gallium and arsenic as a constituent element and which has a band gap larger than that of the first semiconductor;

removing predetermined regions of the collector layer and an upper portion of the base layer to form a mesa structure;

slightly etching a surface of a junction region of the base layer and the collector layer, which is exposed on an edge of the formed mesa structure, using a phosphate-based etchant;

treating said surface of said junction region of the base layer and the collector layer using a sulfur or sulfide passivating agent; and covering the surface of the junction region with an insulating film.

6. A method according to claim 5, wherein the step of covering the surface includes the step of covering the surface of the junction region by an ECR-CVD method.

7. A method according to claim 5, wherein the first and second semiconductors contain, as a constituent element, at least one element selected from the group consisting of aluminum, indium, phosphorus, and antimony.

8. A method according to claim 5, wherein the step of covering the junction region includes the step of covering the surface of the junction region with an SiN film by the ECR-CVD method and thereafter performing annealing at 380° to 520° C.

9. A method of manufacturing a heterojunction bipolar transistor, including the steps of:

forming, on a base layer of a first semiconductor which contains at least one of gallium and arsenic as a constituent element, an emitter layer of a second semiconductor which has at least one of gallium and arsenic as a constituent element and which has a band gap larger than that of the first semiconductor;

removing predetermined regions of the emitter layer and an upper portion of the base layer to form a mesa structure using a phosphate-based etchant;

treating a surface of a junction region of the base layer and the emitter layer using a sulfur or sulfide passivating agent; and covering the surface of the junction region with an insulating film.

10. A method of manufacturing a heterojunction bipolar transistor, including the steps of:

forming, on a base layer of a first semiconductor which contains at least one of gallium and arsenic as a constituent element, a collector layer of a second semiconductor which has at least one of gallium and arsenic as a constituent element and which has a band gap larger than that of the first semiconductor;

removing predetermined regions of the collector layer and an upper portion of the base layer to form a mesa structure using a phosphate-based etchant;

treating a surface of a junction region of the base layer and the collector layer using a sulfur or sulfide passivating agent; and covering the surface of the junction region with an insulating film.

* * * * *